United States Patent
Li et al.

(10) Patent No.: US 7,018,469 B2
(45) Date of Patent: Mar. 28, 2006

(54) ATOMIC LAYER DEPOSITION METHODS OF FORMING SILICON DIOXIDE COMPRISING LAYERS

(75) Inventors: Li Li, Meridian, ID (US); Weimin Li, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 191 days.

(21) Appl. No.: 10/669,667

(22) Filed: Sep. 23, 2003

(65) Prior Publication Data

US 2005/0061234 A1    Mar. 24, 2005

(51) Int. Cl.
  *C30B 25/14* (2006.01)
(52) U.S. Cl. .............. 117/89; 117/92; 117/95; 117/102
(58) Field of Classification Search .......... 117/89, 117/92, 95, 102
See application file for complete search history.

(56) References Cited

U.S. PATENT DOCUMENTS

| | | | |
|---|---|---|---|
| 6,511,539 B1 * | 1/2003 | Raaijmakers | ............ 117/102 |
| 6,605,549 B1 | 8/2003 | Leu et al. | |
| 6,713,873 B1 | 3/2004 | O'Loughlin et al. | |
| 2001/0024387 A1 | 9/2001 | Raaijmakers et al. | |
| 2001/0041250 A1 | 11/2001 | Werkhoven et al. | |
| 2002/0081759 A1 | 6/2002 | Huang et al. | |
| 2003/0032281 A1 | 2/2003 | Werkhoven et al. | |
| 2003/0064607 A1 | 4/2003 | Leu et al. | |
| 2003/0129826 A1 | 7/2003 | Werkhoven et al. | |
| 2003/0200917 A1 | 10/2003 | Vaartstra | |
| 2003/0205823 A1 | 11/2003 | Leu et al. | |

FOREIGN PATENT DOCUMENTS

| | | |
|---|---|---|
| EP | 1107302 | 6/2001 |
| WO | WO 0166832 | 9/2001 |

OTHER PUBLICATIONS

"Digital Chemical Vapor Deposition of $SiO_2$ using a Repetitive Reaction of Triethysilane/Hydrogen and Oxidation"; Sakaue et al.; Japanese Journal of Applied Physics, vol. 30, No. 1B; Jan. 1990; pp. L124-L127.
PCT/US2004/029478; Filed Sep. 9, 2004; Search Report.

* cited by examiner

*Primary Examiner*—Felisa Hiteshew
(74) *Attorney, Agent, or Firm*—Wells St. John P.S.

(57) ABSTRACT

A substrate is positioned within a deposition chamber. Trimethylsilane is flowed to the chamber and a first inert gas is flowed to the chamber under conditions effective to chemisorb a first species monolayer comprising silicon onto the substrate. The first inert gas is flowed at a first rate. After forming the first species monolayer, an oxidant is flowed to the chamber and a second inert gas is flowed to the chamber under conditions effective to react the oxidant with the chemisorbed first species and form a monolayer comprising silicon dioxide on the substrate. The second inert gas flowing is at a second rate which is less than the first rate. The a) trimethylsilane and first inert gas flowing and the b) oxidant and second inert gas flowing are successively repeated effective to form a silicon dioxide comprising layer on the substrate. Other implementations and aspects are contemplated.

49 Claims, 1 Drawing Sheet

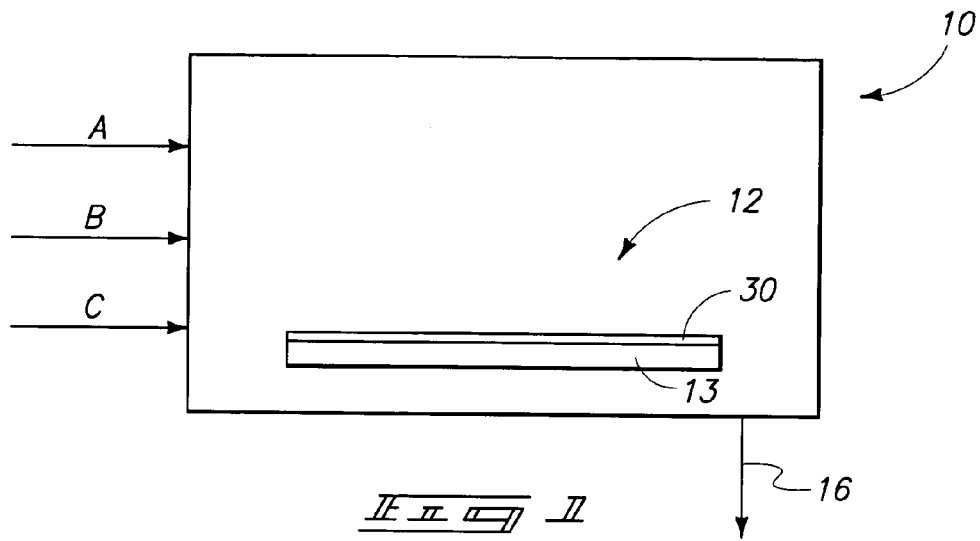
_Fig. 1_
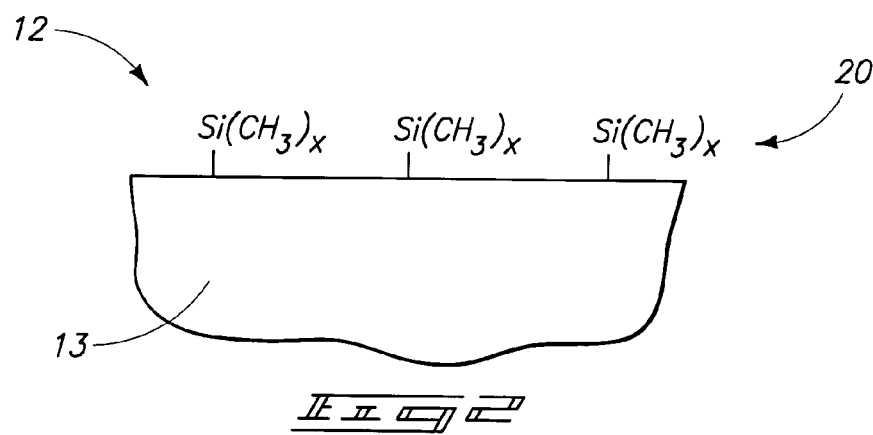
_Fig. 2_
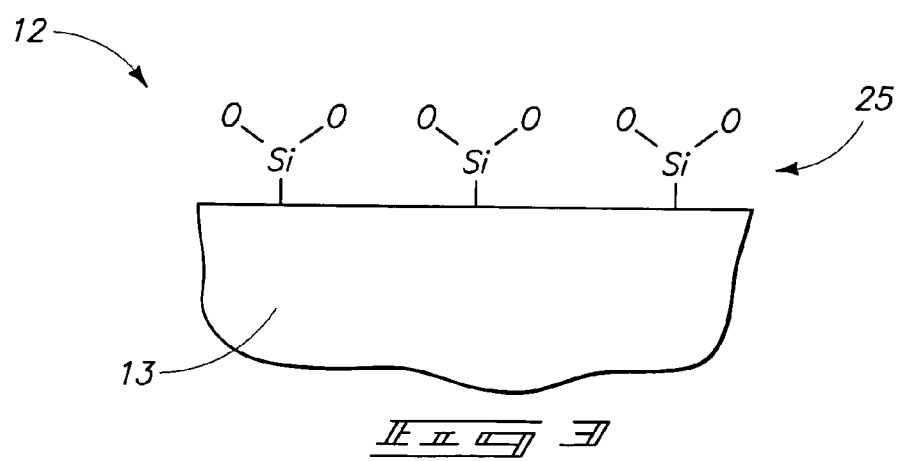
_Fig. 3_

ATOMIC LAYER DEPOSITION METHODS OF FORMING SILICON DIOXIDE COMPRISING LAYERS

TECHNICAL FIELD

This invention relates to atomic layer deposition methods of forming silicon dioxide comprising layers.

BACKGROUND OF THE INVENTION

Semiconductor processing in the fabrication of integrated circuitry involves the deposition of layers on semiconductor substrates. Exemplary processes include chemical vapor deposition (CVD) and atomic layer deposition (ALD). CVD and ALD can be conducted within chambers which retain a single substrate upon a wafer holder or susceptor. Multiple substrate chambers might also be utilized. One or more precursor gases are typically provided to a showerhead within the chamber which is intended to uniformly provide the reactant gases substantially homogenously over the outer surface of the substrate. The precursors react or otherwise manifest in a deposition of a suitable layer atop the substrate. Plasma enhancement may or may not be utilized. If plasma enhancement is utilized, the plasma can be generated and maintained either directly within the chamber or remotely therefrom.

One commonly utilized insulative or dielectric material in semiconductor fabrication is silicon dioxide.

SUMMARY OF THE INVENTION

The invention includes atomic layer deposition methods of forming silicon dioxide comprising layers. In one implementation, a substrate is positioned within a deposition chamber. Trimethylsilane is flowed to the chamber and a first inert gas is flowed to the chamber under conditions effective to chemisorb a first species monolayer comprising silicon onto the substrate. The first inert gas is flowed at a first rate. After forming the first species monolayer, an oxidant is flowed to the chamber and a second inert gas is flowed to the chamber under conditions effective to react the oxidant with the chemisorbed first species and form a monolayer comprising silicon dioxide on the substrate. The second inert gas flowing is at a second rate which is less than the first rate. The a) trimethylsilane and first inert gas flowing and the b) oxidant and second inert gas flowing are successively repeated effective to form a silicon dioxide comprising layer on the substrate.

In one implementation, an atomic layer deposition method of forming a silicon dioxide comprising layer on a substrate includes positioning a substrate within a deposition chamber. Trimethylsilane is flowed to the chamber under conditions effective to chemisorb a first species monolayer comprising silicon onto the substrate. After forming the first species monolayer, an oxidant is flowed to the chamber under conditions effective to react the oxidant with the chemisorbed first species and form a monolayer comprising silicon dioxide on the substrate. The oxidant is flowed to the chamber at a flow rate of at least 2000 sccm. The trimethylsilane and oxidant flowings are successively repeated effective to form a silicon dioxide comprising layer on the substrate.

Other implementations and aspects are contemplated.

BRIEF DESCRIPTION OF THE DRAWINGS

Preferred embodiments of the invention are described below with reference to the following accompanying drawings.

FIG. 1 is a diagrammatic view of a deposition chamber used in accordance with an aspect of the invention.

FIG. 2 is a diagrammatic sectional view of a substrate processed in accordance with an aspect of the invention.

FIG. 3 is a view of the FIG. 2 substrate at a processing step subsequent to that shown by FIG. 2.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses atomic layer deposition methods of forming a silicon dioxide comprising layer on the substrate, for example a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. While the invention is directed to an ALD method of forming a silicon dioxide comprising layer, the invention does not preclude such a layer as being formed as part of a silicon dioxide comprising layer formed by methods other than ALD. For example and by way of example only, the method contemplates ALD methods of forming a silicon dioxide comprising layer over a silicon dioxide comprising layer deposited by CVD, and/or a silicon dioxide comprising layer deposited by CVD over a silicon dioxide comprising layer formed by ALD in accordance with aspects of the invention. In other words, the invention also encompasses combining methodical aspects of the invention with CVD processes in forming a composite or homogenous silicon dioxide comprising layer on a substrate.

ALD is sometimes also referred to as atomic layer epitaxy, atomic layer processing, etc. ALD is desirable where the typical intent is to form very thin layers over a substrate. ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer is preferably formed. However, chemisorption might not, and typically does not, occur on all portions of the substrate, such that a discontinuous monolayer is typically initially formed. Nevertheless, such an imperfect monolayer is still a monolayer in the context of this document and as is recognized by people of skill in the art. In many applications, merely a substantially saturated monolayer may be suitable. A substantially saturated monolayer is one that will still yield a deposited layer exhibiting the quality and/or properties desired for such layer.

After exposure to the first species, it is typically purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species. Further, one or more of the first, second and third species can be mixed with an inert gas to speed up pressure saturation within a reaction chamber, or for other purposes.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any substance that allows chemisorption by-products to desorb and reduces the concentration of a species preparatory to introducing another species. A suitable amount of purging can be determined experimentally as known to those skilled in the art. Purging time may be successively reduced to a purge time that yields an increase in film growth rate. An increase in film growth rate might be an indication of a change to a non-ALD process regime and may be used to establish a purge time limit.

ALD is often described as a self-limiting process in that a finite number of sites exist on a substrate to which the first species may chemisorb. The second species might only bond to the first species and thus may also be self-limiting. Once all of the finite number of sites on a substrate are bonded with the first species, the first species will often not bond to other of the first species already bonded with the substrate. However, process conditions can be varied in ALD to promote such bonding and render ALD to not be self-limiting. Accordingly, ALD may also encompass a species forming other than one monolayer at a time by stacking of a species, forming a layer more than one atom or molecule thick. It is further noted that local chemical reactions can occur during ALD (for instance, an incoming reactant molecule can displace a molecule from an existing surface rather than forming a monolayer over the substrate). To the extent that such chemical reactions occur, such are generally confined within an uppermost monolayer of the surface.

ALD can occur within frequently-used ranges of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside traditional temperature and pressure ranges may risk formation of defective monolayers.

The general technology of Chemical Vapor Deposition (CVD) includes a variety of more specific processes, including but not limited to, plasma enhanced CVD and others. CVD is commonly used to form non-selectively a complete, deposited material on a substrate. One characteristic of typical CVD processes is the simultaneous presence of multiple species in the deposition chamber that react together to form the deposited material. Such condition is contrasted with the purging criteria for traditional ALD wherein a substrate is contacted with a single deposition species that chemisorbs to a substrate or to a previously deposited species on a substrate. An ALD process regime may provide a simultaneously contacted plurality of species of a type or under conditions such that ALD chemisorption rather than CVD reaction occurs. Instead of reacting together, the species may chemisorb to a substrate or previously deposited species providing a surface onto which subsequent species may next chemisorb to form a complete layer of desired material.

Under most CVD conditions, deposition occurs largely independent of the composition or surface properties of an underlying substrate. By contrast, chemisorption rate in ALD might be influenced by the composition, crystalline structure, and other properties of a substrate or chemisorbed species.

By way of example only, exemplary methods of forming a silicon dioxide comprising layer on a substrate in accordance with aspects of the invention are described with reference to FIGS. 1–3. The layer formed might comprise, consist essentially of, or consist of silicon dioxide. FIG. 1 diagrammatically shows a deposition chamber 10 within which a substrate 12, for example a semiconductor substrate 13, has been positioned. Deposition chamber 10 is diagrammatically shown as having feed streams A, B and C. More or fewer precursor feed streams could of course be provided. Further, feed streams might be combined and mixed prior to feeding to chamber 10. Showerheads or other distribution devices (not shown) might also, of course, be provided within chamber 10. An exemplary vacuum controlling drawdown/exhaust line 16 extends from chamber 10 for exhausting unreacted gas and by-product from the substrate, and for controlling chamber pressure. The deposition conditions can comprise plasma generation of at least one or all of the precursors, or be void of plasma generation of any of the precursors. Further, any such plasma generation might be within deposition chamber 10 and/or remote therefrom.

In one implementation, trimethylsilane is flowed to the chamber and a first inert gas is flowed to the chamber under conditions effective to chemisorb a first species monolayer comprising silicon onto the substrate. FIG. 2 depicts an exemplary first species monolayer 20 comprising silicon bonded to/with the substrate 13 and one or more remnant methyl groups. An exemplary first inert gas includes helium. Of course, the first inert gas might also constitute a mixture of inert gases. By way of example only, exemplary preferred pressure conditions include from 1 Torr to 400 Torr. An exemplary preferred temperature range, for example by means of a temperature controlled chuck, includes anywhere from 20° C. to 1000° C.

The inert gas flowing is conducted at some first rate the materiality of which, with respect to one aspect of the invention, will be inherent from the continuing discussion. The invention was reduced-to-practice in a reactor/chamber having an internal volume of 5200 $cm^3$. Trimethylsilane was flowed at a rate of 175 sccm, and helium at 8000 sccm, for 2 seconds. Reactor pressure was 100 Torr, and chuck temperature was 125° C.

After forming the first species monolayer, an oxidant is flowed to the chamber and a second inert gas is flowed to the chamber under conditions effective to react the oxidant with the chemisorbed first species and form a monolayer comprising silicon dioxide on the substrate. In one implementation, the second inert gas flowing is at a second rate which is less than the first rate. By way of example only, FIG. 2 depicts a monolayer 25 comprising silicon dioxide formed by displacement or substitution of the FIG. 2 methyl groups with oxygen atoms of the oxidant.

Preferably prior to flowing the oxidant to the chamber, the reactor is purged of non-adhered trimethylsilane. In one exemplary implementation, such occurs by ceasing the flow of the trimethylsilane to the chamber while flowing the first inert gas to the chamber for a time period effective to purge trimethylsilane from the chamber. Such inert gas flowing while purging the trimethylsilane might be at the same first rate of inert gas flowing during the initial chemisorption, or at a different rate.

The first and second inert gases might be the same, or might be different. Further, the oxidant flowing might be void of plasma within the chamber, might comprise plasma within the chamber, and/or be activated/energized prior to feeding to the chamber by remote plasma.

The second rate of inert gas flowing while flowing the oxidant is preferably no more than 50% of the first rate of flowing the first inert gas to the chamber during the trimethyl silane flowing, and more preferably no more than 40% of the first rate. Further preferably, the second rate is at least 25% of the first rate, more preferably at least 30% of the first rate, and even more preferably at least 35% of the first rate.

It has been discovered that forming a silicon dioxide comprising layer by ALD utilizing trimethylsilane with a second rate inert gas flowing which is lower the first rate of a first inert gas flowing can result in a more complete/continuous monolayer formation of silicon dioxide. For example, one typical way of quantifying the degree of saturation of the formed monolayer on a substrate is by referring to the average thickness of a monolayer after a single cycle of the respective reactive precursor flowings. For example, a 100% saturated monolayer of silicon dioxide formed onto a substrate would be expected to have a thickness of from about 3 Angstroms to 4 Angstroms. Typical prior art silicon dioxide ALD processes achieve an average thickness across the substrate of only about 1 Angstrom or less, indicating one-third (⅓) or less coverage on average over the substrate. In accordance with one preferred aspect and implementation of the invention, each of the silicon dioxide comprising monolayers is formed to an average thickness of at least 2 Angstroms, and more preferably to a thickness of at least 3 Angstroms.

In one preferred implementation, the stated trimethylsilane flowing is for some first period of time, and the oxidant flowing is for some second period of time which is longer than the first period of time. In one preferred implementation, the second time period is at least twice as long as the first. In one preferred implementation, the second time period is more than 2.5 seconds, while the first time period is no greater than 2.5 seconds. By way of example only, an example trimethylsilane flowing time period is from 1 second to 5 seconds, with 2 seconds being a specific preferred example. Further by way of example only, a preferred oxidant flowing time period is from 1 second to 10 seconds, with 5 seconds being a specific preferred example.

The conditions, for example temperature and pressure, during the oxidant flowing might be the same or different as the conditions during the trimethylsilane flowing, and for example as provided above. In one exemplary reduction-to-practice example, the oxidant included a combination of 12% by volume $O_3$ and 88% by volume $O_2$ flowed at a combined rate of 5000 sccm. The inert gas was helium flowed at 3000 sccm, which was 37.5% by volume of the flow rate of the inert gas during the trimethylsilane flowing. Substrate or chuck temperature was 125° C., and internal reactor pressure was maintained at about 100 Torr. Such processing continued for 5 seconds. Any alternate oxidant could be utilized, of course, whether existing or yet-to-be developed. By way of example only, examples include oxygen radicals, $H_2O$, $H_2O_2$, NO, $N_2O$, etc.

The trimethylsilane and first inert gas flowing, along with the oxidant and second inert gas flowing, are successively repeated effective to form a silicon dioxide comprising layer on the substrate, for example layer 30 as depicted in FIG. 1.

In one preferred embodiment, purging of the chamber preferably occurs after forming the silicon dioxide comprising monolayer with the oxidant. In one preferred implementation, such purging occurs by ceasing flow of the oxidant to the chamber while flowing the second inert gas to the chamber effective to purge the oxidant from the chamber. An example preferred time period for the inert gas flowing is anywhere from 1 second to 10 seconds, with 5 seconds being a specific example. Of course, the first inert gas flowing time period while purging trimethylsilane at the first rate might be the same or different than the second inert gas flowing time period while purging oxidant.

In accordance with another aspect of the invention, and independent of that described above, the invention contemplates an ALD method of forming a silicon dioxide comprising layer on a substrate which includes flowing trimethylsilane to the chamber under conditions effective to chemisorb a first species monolayer comprising silicon onto the substrate. An inert gas may or may not be flowed to the chamber during the trimethylsilane flowing. Regardless, after forming the first species monolayer, an oxidant is flowed to the chamber under conditions effective to react the oxidant with the chemisorbed first species and form a monolayer comprising silicon dioxide on the substrate. An inert gas may or may not be flowed to the chamber during the oxidant flowing. The oxidant is flowed to the chamber at a rate of at least 2000 sccm, preferably at a rate of at least 3000 sccm, more preferably at a rate of at least 4000 sccm, and most preferably at a rate of at least 5000 sccm. Such trimethylsilane and oxidant flowings are successively repeated effective to form a silicon dioxide comprising layer on the substrate.

Prior art oxidant flow rates to a chamber during an ALD process of silicon dioxide are understood to be appreciably less than 2000 sccm, and specifically less than 1000 sccm. Providing an increased oxidant flow rate as herein described, and independent of reactor volume, can enable a more complete or saturated monolayer of silicon dioxide to be formed over a substrate, and perhaps independent of the attributes described above with respect to the first embodiments. However and regardless, preferred processing is further in accordance with each of the above described first embodiments in accordance with preferred aspects of this latter implementation of the invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An atomic layer deposition method of forming a silicon dioxide-comprising layer on a substrate, comprising:
   providing a substrate within a deposition chamber;
   flowing trimethylsilane to the chamber and flowing a first inert gas to the chamber under conditions effective to chemisorb a first species monolayer comprising silicon onto the substrate, the first inert gas-flowing being at a first rate;
   after forming the first species monolayer, flowing an oxidant to the chamber and flowing a second inert gas to the chamber under conditions effective to react the oxidant with the chemisorbed first species and form a monolayer comprising silicon dioxide on the substrate; the second inert gas-flowing being at a second rate which is less than the first rate; and successively repeating said a) trimethylsilane and first inert gas-flowing and b) oxidant and second inert gas-flowing effective to form a silicon dioxide-comprising layer on the substrate.

2. The method of claim 1 wherein the second rate is no more than 50% of the first rate.

3. The method of claim 1 wherein the second rate is no more than 40% of the first rate.

4. The method of claim 1 wherein the second rate is from 25% to 50% of the first rate.

5. The method of claim 1 wherein the second rate is from 25% to 40% of the first rate.

6. The method of claim 1 wherein the second rate is from 30% to 40% of the first rate.

7. The method of claim 1 wherein the second rate is from 35% to 40% of the first rate.

8. The method of claim 1 wherein the first and second inert gases are the same.

9. The method of claim 1 wherein the first and second inert gases are the different.

10. The method of claim 1 wherein each of the silicon dioxide-comprising monolayers is formed to an average thickness of at least 2 Angstroms.

11. The method of claim 1 wherein each of the silicon dioxide-comprising monolayers is formed to an average thickness of at least 3 Angstroms.

12. The method of claim 1 wherein the oxidant is flowed to the reactor at a rate of at least 2000 sccm.

13. The method of claim 1 wherein the oxidant is flowed to the reactor at a rate of at least 3000 sccm.

14. The method of claim 1 wherein the oxidant is flowed to the reactor at a rate of at least 4000 sccm.

15. The method of claim 1 wherein the oxidant is flowed to the reactor at a rate of at least 5000 sccm.

16. The method of claim 1 wherein the oxidant-flowing is void of plasma within the chamber.

17. The method of claim 1 wherein the second rate is from 35% to 40% of the first rate, each of the silicon dioxide-comprising monolayers is formed to an average thickness of at least 3 Angstroms, and the oxidant is flowed to the reactor at a rate of at least 2000 sccm.

18. The method of claim 1 wherein said trimethylsilane-flowing is for a first time period and said oxidant-flowing is for a second time period, the second time period being longer than the first time period.

19. The method of claim 18 wherein the second time period is at least twice as long as the first time period.

20. The method of claim 18 wherein the second time period is more than 2.5 seconds, and the first time period is no greater than 2.5 seconds.

21. An atomic layer deposition method of forming a silicon dioxide-comprising layer on a substrate, comprising:

providing a substrate within a deposition chamber;

(a) flowing trimethylsilane to the chamber and flowing inert gas to the chamber under conditions effective to chemisorb a first species monolayer comprising silicon onto the substrate, the inert gas-flowing being at a first rate;

(b) after forming the first species monolayer, ceasing flow of the trimethylsilane to the chamber while flowing the inert gas to the chamber effective to purge trimethylsilane from the chamber;

(c) after purging the trimethylsilane from the chamber, flowing an oxidant and flowing the inert gas to the chamber under conditions effective to react the oxidant with the chemisorbed first species and form a monolayer comprising silicon dioxide on the substrate; the inert gas-flowing during the oxidant-flowing being at a second rate which is less than the first rate;

(d) after forming the silicon dioxide-comprising monolayer, ceasing flow of the oxidant to the chamber while flowing the inert gas to the chamber effective to purge oxidant from the chamber; and successively repeating said (a)–(d) flowings effective to form a silicon dioxide-comprising layer on the substrate.

22. The method of claim 21 wherein the inert gas-flowing while purging trimethylsilane is at the first rate.

23. The method of claim 21 wherein the inert gas-flowing while purging oxidant is at the first rate.

24. The method of claim 21 wherein the inert gas-flowing while purging trimethylsilane is at the first rate, and the inert gas-flowing while purging oxidant is at the first rate.

25. The method of claim 21 wherein each of the silicon dioxide-comprising monolayers is formed to an average thickness of at least 2 Angstroms.

26. The method of claim 21 wherein each of the silicon dioxide-comprising monolayers is formed to an average thickness of at least 3 Angstroms.

27. The method of claim 21 wherein the second rate is no more than 50% of the first rate.

28. The method of claim 21 wherein the second rate is no more than 40% of the first rate.

29. The method of claim 21 wherein the second rate is from 25% to 40% of the first rate.

30. The method of claim 21 wherein the second rate is from 30% to 40% of the first rate.

31. The method of claim 21 wherein the second rate is from 35% to 40% of the first rate.

32. The method of claim 21 wherein the oxidant is flowed to the reactor at a rate of at least 2000 sccm.

33. The method of claim 21 wherein the second rate is from 35% to 40% of the first rate, each of the silicon dioxide-comprising monolayers is formed to an average thickness of at least 3 Angstroms, and the oxidant is flowed to the reactor at a rate of at least 2000 sccm.

34. The method of claim 21 wherein the oxidant-flowing is void of plasma within the chamber.

35. The method of claim 21 wherein the (a) flowing is for a first time period and the (c) flowing is for a second time period, the second time period being longer than the first time period.

36. The method of claim 35 wherein the second time period is at least twice as long as the first time period.

37. The method of claim 35 wherein the second time period is more than 2.5 seconds, and the first time period is no greater than 2.5 seconds.

38. An atomic layer deposition method of forming a silicon dioxide-comprising layer on a substrate, comprising:

providing a substrate within a deposition chamber;

flowing trimethylsilane to the chamber under conditions effective to chemisorb a first species monolayer comprising silicon onto the substrate;

after forming the first species monolayer, flowing an oxidant to the chamber under conditions effective to react the oxidant with the chemisorbed first species and form a monolayer comprising silicon dioxide on the substrate; the oxidant being flowed to the chamber at a flow rate of at least 2000 sccm; and successively repeating said trimethylsilane and oxidant-flowings effective to form a silicon dioxide-comprising layer on the substrate.

39. The method of claim 38 wherein the oxidant flow rate to the chamber is at least 3000 sccm.

40. The method of claim 38 wherein the oxidant flow rate to the chamber is at least 4000 sccm.

41. The method of claim 38 wherein the oxidant flow rate to the chamber is at least 5000 sccm.

42. The method of claim 38 wherein the oxidant is a mixture of $O_3$ and $O_2$.

43. The method of claim 38 wherein the oxidant-flowing is void of plasma within the chamber.

44. The method of claim 38 wherein the oxidant is a mixture of $O_3$ and $O_2$, and is void of plasma within the chamber.

45. The method of claim 38 wherein each of the silicon dioxide-comprising monolayers is formed to an average thickness of at least 2 Angstroms.

46. The method of claim 38 wherein each of the silicon dioxide-comprising monolayers is formed to an average thickness of at least 3 Angstroms.

47. The method of claim 38 wherein said trimethylsilane-flowing is for a first time period and said oxidant-flowing is for a second time period, the second time period being longer than the first time period.

48. The method of claim 47 wherein the second time period is at least twice as long as the first time period.

49. The method of claim 47 wherein the second time period is more than 2.5 seconds, and the first time period is no greater than 2.5 seconds.

* * * * *

UNITED STATES PATENT AND TRADEMARK OFFICE
CERTIFICATE OF CORRECTION

PATENT NO. : 7,018,469 B2  Page 1 of 1
APPLICATION NO. : 10/669667
DATED : March 28, 2006
INVENTOR(S) : Li Li et al.

It is certified that error appears in the above-identified patent and that said Letters Patent is hereby corrected as shown below:

Column 5, line 18, replace "lower the first rate" with --lower than the first rate--.

Column 7, line 23, replace "are the different" with --are different--.

Signed and Sealed this

Tenth Day of April, 2007

JON W. DUDAS
*Director of the United States Patent and Trademark Office*